(12) United States Patent
Nakabayashi et al.

(10) Patent No.: US 10,446,725 B2
(45) Date of Patent: Oct. 15, 2019

(54) LIGHT EMITTING DEVICE

(71) Applicant: NICHIA CORPORATION, Anan-shi, Tokushima (JP)

(72) Inventors: Takuya Nakabayashi, Tokushima (JP); Tadaaki Ikeda, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/888,266

(22) Filed: Feb. 5, 2018

(65) Prior Publication Data
US 2018/0226549 A1   Aug. 9, 2018

(30) Foreign Application Priority Data
Feb. 9, 2017  (JP) ................................. 2017-022042

(51) Int. Cl.
*H01L 33/60* (2010.01)
*H01L 25/075* (2006.01)
(Continued)

(52) U.S. Cl.
CPC .......... *H01L 33/60* (2013.01); *C09K 11/0883* (2013.01); *C09K 11/617* (2013.01);
(Continued)

(58) Field of Classification Search
CPC . H01L 33/54; H01L 33/56; H01L 33/50–507; H01L 33/60; H01L 33/62;
(Continued)

(56) References Cited

U.S. PATENT DOCUMENTS

| 9,099,333 B2 * | 8/2015 | Imamura | H01L 25/0753 |
| 2007/0205712 A1 * | 9/2007 | Radkov | C09K 11/0838 |
| | | | 313/503 |

(Continued)

FOREIGN PATENT DOCUMENTS

| JP | H02-168634 A | 6/1990 |
| JP | 2010-198919 A | 9/2010 |

(Continued)

*Primary Examiner* — Zandra V Smith
*Assistant Examiner* — Jeremy J Joy
(74) *Attorney, Agent, or Firm* — Global IP Counselors, LLP

(57) ABSTRACT

A light emitting device includes a mounting board, first and second light emitting elements and a light reflective covering member. The mounting board includes an insulating base, first and second lands arranged, and an intermediate part arranged between the first and second lands. The first and second light emitting elements are flip-chip mounted on the first and second lands, respectively. The light reflective covering member is provided above the intermediate part and covers lateral surfaces of the first and second light emitting elements. The light reflective covering member defines a recess part arranged above the intermediate part with a bottom of the recess part being positioned below top surfaces of the first and second light emitting elements and above the top surface of the intermediate part, and a surface of the light reflective covering member defining the recess part constitutes a part of an outer surface of the light emitting device.

13 Claims, 4 Drawing Sheets

(51) Int. Cl.
*H01L 23/00* (2006.01)
*H01L 33/62* (2010.01)
*C09K 11/08* (2006.01)
*C09K 11/61* (2006.01)
*C09K 11/77* (2006.01)
*H01L 33/50* (2010.01)
*H01L 33/48* (2010.01)
*H01L 33/64* (2010.01)

(52) U.S. Cl.
CPC ........ *C09K 11/7734* (2013.01); *H01L 23/562* (2013.01); *H01L 25/0753* (2013.01); *H01L 33/62* (2013.01); *H01L 33/486* (2013.01); *H01L 33/502* (2013.01); *H01L 33/642* (2013.01)

(58) Field of Classification Search
CPC ......... H01L 25/0753; H01L 2924/1861; H01L 2924/1815
See application file for complete search history.

(56) References Cited

U.S. PATENT DOCUMENTS

| | | | |
|---|---|---|---|
| 2011/0303928 A1 | 12/2011 | Kawabata | |
| 2012/0319563 A1* | 12/2012 | Ishihara | H01L 33/505 313/498 |
| 2013/0329440 A1* | 12/2013 | Tsutsumi | F21S 41/663 362/465 |
| 2014/0153238 A1 | 6/2014 | Nishimura et al. | |
| 2014/0362570 A1* | 12/2014 | Miyoshi | F21K 9/68 362/240 |
| 2015/0001563 A1 | 1/2015 | Miki | |
| 2015/0102366 A1 | 4/2015 | Wada | |
| 2015/0263239 A1 | 9/2015 | Watanabe | |
| 2015/0380622 A1* | 12/2015 | Miyoshi | H01L 33/486 257/88 |
| 2016/0133809 A1* | 5/2016 | Kuramoto | H01L 33/0095 438/27 |
| 2016/0155914 A1 | 6/2016 | Miki | |
| 2016/0167949 A1* | 6/2016 | Jiang | B81B 7/0048 257/415 |
| 2016/0181483 A1 | 6/2016 | Eichenberg et al. | |
| 2016/0240735 A1* | 8/2016 | Moran | H01L 33/20 |
| 2016/0284959 A1* | 9/2016 | Ishikawa | H01L 25/0753 |

FOREIGN PATENT DOCUMENTS

| | | |
|---|---|---|
| JP | 2010-278266 A | 12/2010 |
| JP | 2013-506985 A | 2/2013 |
| JP | 2014-132629 A | 7/2014 |
| JP | 2014-236175 A | 12/2014 |
| JP | 2015-012081 A | 1/2015 |
| JP | 2015-053326 A | 3/2015 |
| JP | 2015-079805 A | 4/2015 |
| JP | 2015-159258 A | 9/2015 |
| JP | 2015-176946 A | 10/2015 |
| JP | 2016-027620 A | 2/2016 |
| JP | 2016-66680 A | 4/2016 |
| JP | 2016-518713 A | 6/2016 |
| JP | 2016-532898 A | 10/2016 |
| WO | 2011039509 A1 | 4/2011 |

* cited by examiner

LIGHT EMITTING DEVICE

CROSS-REFERENCE TO RELATED APPLICATIONS

This application claims priority to Japanese Patent Application No. 2017-022042 filed on Feb. 9, 2017. The entire disclosure of Japanese Patent Application No. 2017-022042 is hereby incorporated herein by reference.

The present disclosure relates to a light emitting device.

In Japanese Patent Publication No. 2015-079805, for example, described is a light emitting device provided with: a plurality of semiconductor light emitting elements arranged on the surface of a mounting board with gaps left open; transparent phosphor plates provided individually on the plurality of semiconductor light emitting elements; a transparent adhesive member that is adhesively fixed to the top surface of the semiconductor light emitting elements and the bottom surface of the phosphor plates; and a reflective layer that contains light reflective fine particles surrounding the semiconductor light emitting elements and the phosphor plates.

SUMMARY

In the light emitting device noted in the abovementioned Japanese Patent Publication No. 2015-079805, thermal stress tends to be accumulated to the reflective layer disposed between two semiconductor light emitting elements, and that leads to the probability of cracks forming in the main part of the reflective layer.

Based on that, the purpose of an embodiment of the present disclosure is to provide a light emitting device for which it is possible to reduce the occurrence of cracks in the main part of a light reflective covering member covering the periphery of the plurality of light emitting elements.

A light emitting device according to one embodiment includes a mounting board, first and second light emitting elements and a light reflective covering member. The mounting board includes an insulating base, a first land and a second land arranged on a top surface of the insulating base, and an intermediate part arranged between the first land and the second land with a top surface of the intermediate part being positioned below a top surface of the first land and a top surface of the second land that are adjacent to the intermediate part. The first and second light emitting elements are flip-chip mounted on the first and second lands, respectively. The light reflective covering member is provided above the intermediate part. The light reflective covering member covers lateral surfaces of the first and second light emitting elements. The light reflective covering member defines a recess part arranged above the intermediate part with a bottom of the recess part being positioned below a top surface of the first light emitting element and a top surface of the second light emitting element and above the top surface of the intermediate part, and a surface of the light reflective covering member defining the recess part constituting a part of an outer surface of the light emitting device.

With the light emitting device of an embodiment of the present disclosure, it is possible to reduce the occurrence of cracks in the main part of the covering member.

DETAILED DESCRIPTION OF EMBODIMENTS

Figure 1A:
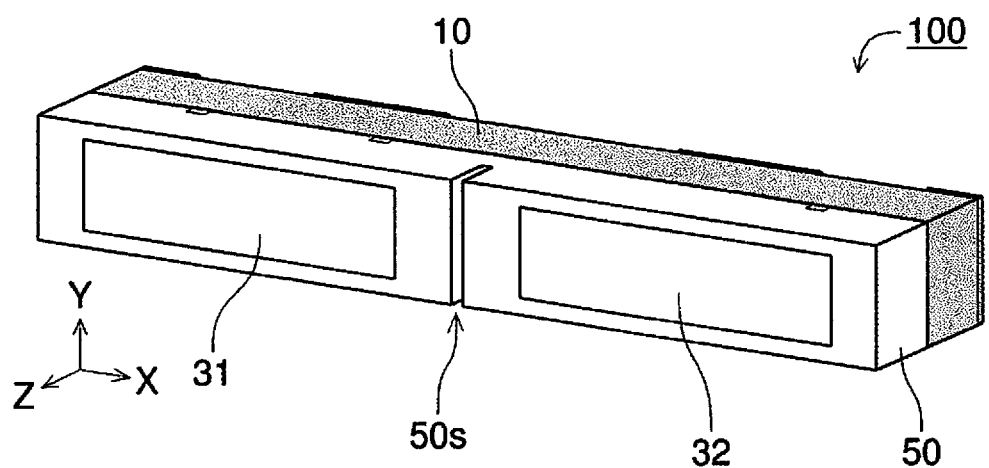
FIG. 1A is a schematic perspective view of a light emitting device of an embodiment of the present disclosure.

Hereafter, embodiments of the present disclosure are explained while referring to the drawings as appropriate. However, the light emitting device explained hereafter is for embodying the technical concept of the present disclosure, and unless specifically noted, the present disclosure is not limited to the following. Also, the size, positional relationship, etc., of the members shown in the drawings may sometimes be exaggerated to clarify the explanation.

Also, the visible wavelength range is in a range of wavelength 380 nm-780 nm, the blue range is in a range of wavelength 420 nm-480 nm, the green range is in a range of wavelength 500 nm-560 nm, the yellow range is the wavelength range of greater than 560 nm and 590 nm or less, and the red range is in a range of wavelength 610 nm-750 nm.

Figure 1B:
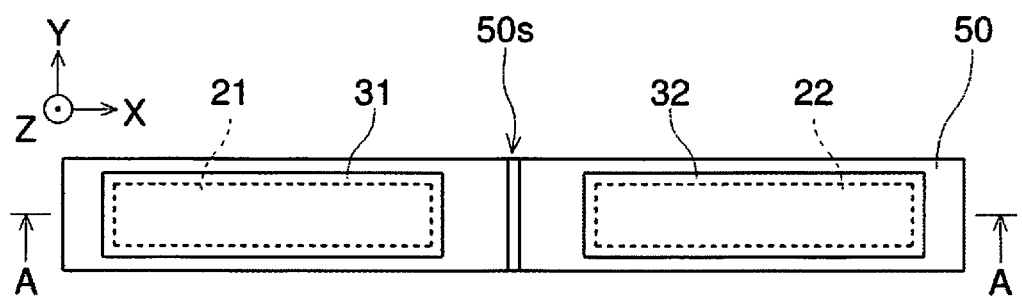
FIG. 1B is a schematic top plan view of the light emitting device shown in FIG. 1A.
Figure 1C:
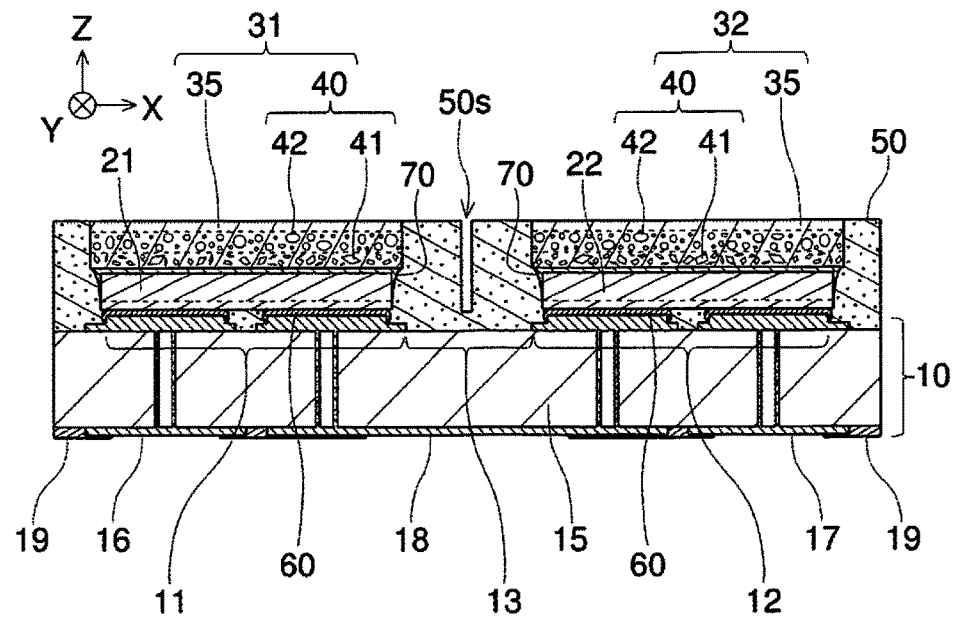
FIG. 1C is a schematic cross section view of the light emitting device as taken along a ling A-A in FIG. 1B.
Figure 1D:
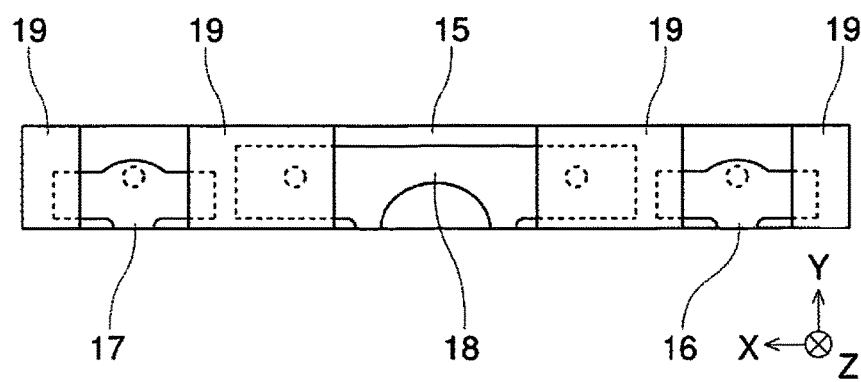
FIG. 1D is a schematic bottom plan view of the light emitting device shown in FIG. 1A.
Figure 1E:
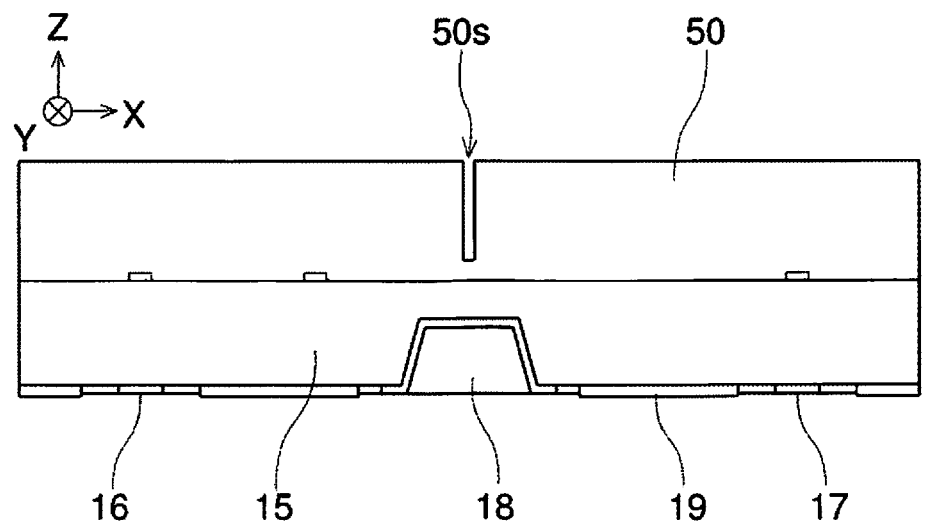
FIG. 1E is a schematic side view of the light emitting device shown in FIG. 1A.
Figure 1F:
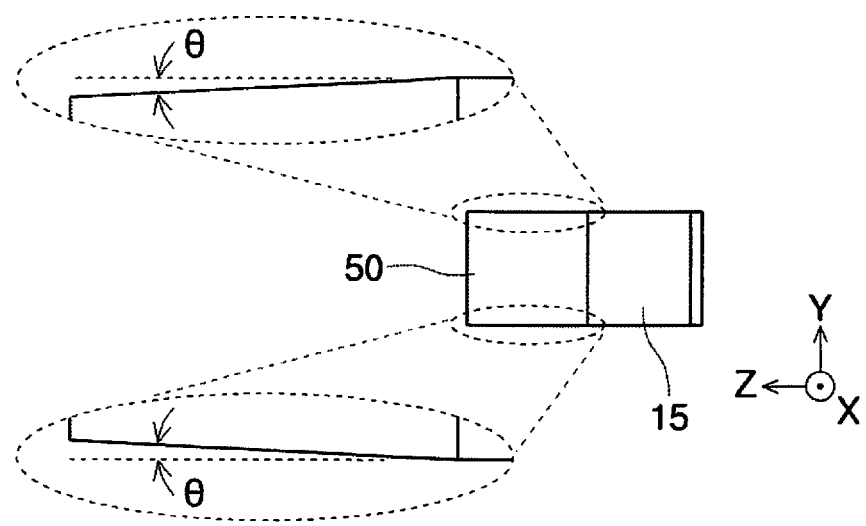
FIG. 1F is a schematic side view of the light emitting device shown in FIG. 1A.
Figure 2:
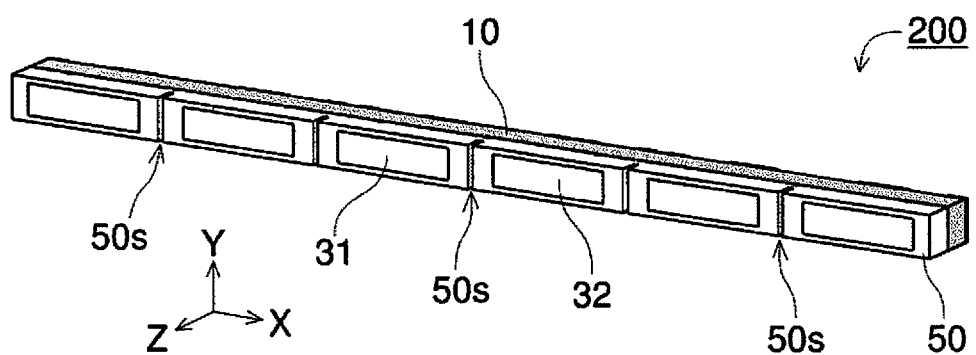
FIG. 2 is a schematic perspective view of another light emitting device of an embodiment of the present disclosure.

FIG. 1A is a schematic perspective view of a light emitting device 100 of Embodiment 1. FIG. 1B is a schematic top plan view of the light emitting device 100 shown in FIG. 1A. FIG. 1C is a schematic cross section view of the light emitting device as taken along a ling A-A in FIG. 1B. FIG. 1D is a schematic bottom plan view of the light emitting device 100 shown in FIG. 1A. FIG. 1E is a schematic side view of the light emitting device 100 shown in FIG. 1A. FIG. 1F is a schematic side view of the light emitting device 100 shown in FIG. 1A. FIG. 2 is a schematic perspective view of another light emitting device 200 of Embodiment 1.

In FIG. 1A to 1F, with the light emitting device 100, the lateral direction is indicated as the X direction, the vertical direction is indicated as the Y direction, and the front-back (i.e., depth) direction is indicated as the Z direction. Each of these X, Y, and Z directions (i.e., axes) are perpendicular directions (i.e., axes) to the other two directions (i.e., axes). In more detail, the right direction is the X+ direction, the left direction is the X− direction, the upward direction is the Z+ direction, and the downward direction is the Z− direction. The Y− direction is the mounting direction of the light emitting device 100. The Z+ direction is the principal light emitting direction of the light emitting device 100. Hereafter, for each constituent element of the light emitting device 100, the surface positioned at the Z+ direction side is the "top surface," and the surface positioned at the Z− direction side is the "bottom surface."

As shown in FIG. 1A to 1F, the light emitting device 100 of Embodiment 1 is provided with a mounting board 10, a first light emitting element 21, a second light emitting element 22, and a covering member 50. The mounting board 10 is provided with a base 15, and a first land 11, a second land 12, and an intermediate part 13 are included in the top surface. The intermediate part 13 is placed between the first land 11 and the second land 12. The first light emitting element 21 is flip-chip mounted on the first land 11. Specifically, the positive and negative electrodes provided on the bottom surface of the first light emitting element 21 are connected to the first land 11 with a conductive adhesive member 60 interposed. The second light emitting element 22 is flip-chip mounted on the second land 12. Specifically, the positive and negative electrodes provided on the bottom surface of the second light emitting element 22 are connected to the second land 12 with the conductive adhesive member 60 interposed. The covering member 50 is provided on the intermediate part 13. The covering member 50 covers the lateral surface of the first light emitting element 21 and the lateral surface of the second light emitting element 22. The covering member 50 is light reflective. Also, a recess part 50s is formed on the covering member 50 on the intermediate part 13. The bottom of the recess part 50s is below the top surface of the first light emitting element 21 and the top surface of the second light emitting element 22, and above the top surface of the intermediate part 13. The inner surface of the recess part 50s (i.e., the surface of the covering member 50 that defines the recess part 50s) is the outer surface of the light emitting device 100. Specifically, the inside of the recess part 50s is an empty hollow.

According to the light emitting device 100 having such a structure, the recess part 50s having the aforementioned depth can create an allowance for elongation to the covering member 50 on the intermediate part 13, specifically, between the first light emitting element 21 and the second light emitting element 22, making it possible to alleviate the accumulation of the thermal stress, which makes it possible to reduce the formation of cracks in the main part of the covering member 50. Also, by providing the recess part 50s on the top surface side of the intermediate part 13 which is at a position below the top surfaces of the first land 11 and the second land 12, it is possible to have the formation of cracks concentrated between the bottom surface of the recess part 50s and the intermediate part 13, which makes it possible to reduce the probability of cracks forming in the covering member 50 in the main part of the light emitting device 100 (i.e., the vicinity of the light emitting element). In other words, the covering member 50 is deformed in an upwardly convex shape due to thermal stress. The inventors found out that cracks are formed on the covering member 50 due to the load at the time of this deformation. The light emitting device 100 includes the part of the covering member 50 at which the maximum load is applied, by providing the intermediate part 13 which is at the side of the top surface of the base closest to the bottommost surface, at a position separated from the first light emitting element 21, the second light emitting element 22, the first land 11, and the second land 12. Accordingly the load can concentrate on a region of the intermediate part 13, where the reliability of the light emitting device 100 is less likely to effect. As a result, even if cracks form in the covering member 50, the position at which the cracks form can be controlled.

The "main part" of the covering member 50 is the part for which the lateral surface of each of the first light emitting element 21, the second light emitting element 22, as well as a first transmissive member 31 and a second transmissive member 32 described later is directly coated. For example, the cutting remainder of the covering member 50 which is between the bottom of the recess part 50s and the top surface of the intermediate part 13 can be excluded from this "main part". Also, the top surface of the covering member 50 can be flat, or it can be a sunken surface, in other words, a recessed surface, by virtue of resin crawling up due to surface tension before curing and/or curing and contracting. However, the recess part 50s is formed separately from this kind of sunken surface. The recess part 50s can be formed by cutting using a rotating disk type dicing saw, splitting using a saw type or push type cutter, or molding using a mold, etc.

Following is a detailed description of a preferred embodiment of the light emitting device 100.

As shown in FIGS. 1A to 1C, and 1E, the recess part 50s reaches two lateral surfaces respectively facing the Y+ direction and the Y− direction of the covering member 50. In this way, the recess part 50s in the top plan view preferably reaches at least one of two lateral surfaces of the covering member 50, the two lateral surfaces facing the direction perpendicular to the alignment direction of the first land 11 and the second land 12 (i.e., two lateral surfaces extending along the alignment direction of the first land 11 and the second land 12 in the top plan view). Such a recess part 50s can alleviate the accumulation of the thermal stress of the covering member 50 on the intermediate part 13, and can readily alleviate the formation of cracks on the main part of the covering member 50. At this time, the recess part 50s in the top plan view can reach only one of the two lateral surfaces of the covering member 50, the two lateral surfaces facing the direction perpendicular to the alignment direction of the first land 11 and the second land 12, but it is preferable that it reach both of the two lateral surfaces.

From the perspective of making it more readily alleviate accumulating of thermal stress of the covering member 50 on the intermediate part 13, it is preferable that the bottom of the recess part 50s be below the top surface of the semiconductor layer of the first light emitting element 21 and the top surface of the semiconductor layer of the second light emitting element 22. Furthermore, from the same perspective, as shown in FIGS. 1A to 1C and 1E, it is even more preferable that the bottom of the recess part 50s be below the bottom surface of the first light emitting element 21 and the bottom surface of the second light emitting element 22. When the first light emitting element 21 and the second light emitting element 22 have a substrate (hereafter also referred as "element substrate"), it is possible to regard the top surface of the semiconductor layer and the bottom surface of the element substrate as matching.

Also, it is preferable that the recess part 50s be provided at the center part of the covering member 50 between the first light emitting element 21 and the second light emitting element 22, or between the first transmissive member 31 and the second transmissive member 32 described later, in the top plan view. The top plan view shape of the recess part 50s, in addition to the linear form shown in the drawing, can also be in dot form aligned into a linear form. When the shape of the recess part 50s in top plan view is in linear form, in addition to the straight line form shown in the drawing, it can also be a curved line form, a wave line form, a broken line form, or a polygonal line form. When the shape of the recess part 50s in top plan view is a straight line form, it is preferably parallel to the Y direction (i.e., axis) as shown in the drawing, but it is also possible to be inclined with respect to the Y direction (i.e., axis). The shape of the recess part 50s in cross section view can be the rectangular shape as shown in the drawing, but can also be an inverted triangle shape or an inverted trapezoid shape, etc., and the bottom can be rounded. The center axis in the cross section view of the recess part 50s is preferably parallel to the Z direction (i.e., axis) as shown in the drawing, but can also be inclined with respect to the Z direction (i.e., axis). The recess part 50s is not limited to being just one as shown in the drawing, but can also be a plurality.

Also, the lower limit value of the X direction width of the recess part 50s can be selected as appropriate according to the amount of elongation due to thermal expansion of the covering member 50 sandwiching the recess part, but when the covering member 50 thermally expands due to heat applied in the manufacturing process or assembly process, etc., during use of the light emitting device, it is preferable to set this to an amount by which the recess part 50s would still remain. For example, 0.01 mm or greater is preferable, 0.03 mm or greater is more preferable, and 0.1 mm or greater is even more preferable. Also, the upper limit value of the X direction width of the recess part 50s can be selected as appropriate, but from the perspective of ensuring the thickness of the covering member between the first light emitting element 21 and the second light emitting element 22, it is preferably 0.4 mm or less, and more preferably 0.3 mm or less.

As shown in FIG. 1A to 1E, the mounting board 10, the first light emitting element 21, the second light emitting element 22, and the covering member 50 are each long shape elongated in the X direction. In this way, the covering member 50 is preferably long in the alignment direction of the first land 11 and the second land 12. The thermal expansion amount of the covering member 50 becomes greater in the longitudinal direction of the covering member 50, therefore if the covering member 50 is long in the alignment direction of the first land 11 and the second land 12, the thermal stress applied to the covering member 50 on the intermediate part 13 is likely to increase. Thus, there is a higher technical significance to alleviating the accumulating of the thermal stress of the covering member 50 by the recess part 50s.

Employing the base 15 having the smaller the linear expansion coefficient can alleviate shift of the first light emitting element 21 and the second light emitting element 22 fixed to the mounting board 10, thus making it easier for there to be an increase in the thermal stress applied to the covering member 50 positioned between both light emitting elements. Thus, the technical significance increases for alleviating the accumulation of the thermal stress of the covering member 50 by the recess part 50s. Because of this, the linear expansion coefficient of the base 15 of the mounting board can be selected as appropriate, but it is preferably 15 ppm/° C. or less, more preferably 10 ppm/° C. or less, and even more preferably 5 ppm/° C. or less. The lower limit value of the linear expansion coefficient of the base 15 of the mounting board is 1 ppm/° C. or greater, for example.

As shown in FIG. 1F, the lateral surfaces of the covering member 50 positioned at the Y− side are preferably inclined to the inside of the light emitting device 100 with respect to the lateral surface of the mounting board 10 oriented in the Y− direction. As a result, the lateral surface of that covering member 50 is less likely to be contact to a circuit board surface during mounting of this light emitting device 100 on the circuit board, etc., therefore the mounting orientation of the light emitting device 100 tends to be stable. Also, this can alleviate stress due to contact with the circuit board surface in the case of occurrence of thermal expansion of the covering member 50.

The lateral surface of the covering member 50 positioned at the Y+ side is also preferably inclined to the inside of the light emitting device 100 with respect to the lateral surface of the covering member 50, and the lateral surface of the mounting board 10 oriented in the Y+ direction. As a result, contact between the lateral surface of that covering member 50 and a suction nozzle (i.e., collet) is alleviated, reducing the occurrence of damage of the covering member 50 during suction of this light emitting device 100. Also, when this light emitting device 100 is incorporated into a lighting unit, etc., the lateral surface of the mounting board 10 can be in contact with the peripheral components with higher priority than the lateral surface of that covering member 50, capable of alleviating stress distortion of the covering member 50. These things then also contribute to reduce the occurrence of cracks in the main part of the covering member 50. In this way, the lateral surface of the covering member 50 oriented in the direction perpendicular to the alignment direction of the first land 11 and the second land 12 in the top plan view is preferably inclined to the inside of that light emitting device 100 with respect to the lateral surface of the mounting board 10 oriented in the same direction. The incline angle $\theta$ of the two lateral surfaces of this covering member 50 can be selected as appropriate, but from the perspective of the ease of exhibiting this kind of effect and the thickness of the covering member 50, it is preferably 0.3°-3°, more preferably 0.5°-2°, and even more preferably 0.7°-1.5°.

Also, as shown in FIGS. 1D and 1E, the bottom surface of the base 15 of the mounting board preferably has a cavity at a position facing opposite the recess part 50s. With this kind of combination of the cavity and the recess part 50s, it is possible to configure a preferable stress dispersion structure for the covering member 50, and possible to make it even easier to suppress the formation of cracks in the main part of the covering member 50.

As shown in FIG. 1C, the light emitting device 100 is provided with: a first transmissive member 31 that is joined to the top surface of the first light emitting element 21, and includes a wavelength conversion substance 40 that absorbs the light of the first light emitting element 21 and re-emits light; and the second transmissive member 32 that is joined to the top surface of the second light emitting element 22, and includes the wavelength conversion substance 40 that absorbs the light of the second light emitting element 22 and re-emits light. Also, the covering member 50 preferably covers the lateral surface of the first transmissive member 31 and the lateral surface of the second transmissive member 32. With such a structure that the first transmissive member 31 and the second transmissive member 32 that contain the wavelength conversion substance 40 causing heat emission are joined respectively on the top surface of the first light emitting element 21 and the top surface of the second light emitting element 22, it is likely to increase the thermal stress applied to the covering member 50 on the intermediate part 13. Thus, there is higher technical significance to alleviating the accumulation of thermal stress of the covering member 50 by the recess part 50s. With this Embodiment 1, the first transmissive member 31 and the second transmissive member 32 are respectively joined to the first light emitting element 21 and the second light emitting element 22 with a light guide member 70 interposed. In addition, it is also possible to have direct joining of the top surface of the first light emitting element 21 and the bottom surface of the first transmissive member 31, as well as the top surface of the second light emitting element 22 and the bottom surface of the second transmissive member 32.

The wavelength conversion substance 40 preferably contains a manganese activated fluoride-based phosphor. While the manganese activated fluoride-based phosphor is preferable from the perspective of color reproduction with a relatively narrow light emission of a spectral bandwidth obtained, on the other hand, it has the property that is likely to degrades due to moisture. Thus, there is higher technical significance to alleviating the accumulation of thermal stress of the covering member 50 using the recess part 50s, reducing the occurrence of cracks in the main part of the covering member 50, and thus alleviating the intrusion of moisture from the cracks.

The top surface of the intermediate part 13 can have intermediate wiring provided in the intermediate part 13, as long as the top surface of the intermediate part 13 is below the adjacent top surface of the first land and the top surface of the second land. The intermediate wiring is preferably wiring that contributes to the power supply to the first light emitting element 21 and the second light emitting element 22. In such a case, corrosion of the intermediate wiring 13 is likely to effect on the operation of the first light emitting element 21 and the second light emitting element 22. Because of this, using the recess part 50s of the aforementioned depth, there is higher technical significance with alleviation of corrosion by reducing exposure of the intermediate wiring 13 to the device exterior.

Hereafter, an explanation is given of each constituent of the light emitting device according to an embodiment of the present disclosure.

Light Emitting Device 100

The light emitting device is, for example, a light emitting diode (LED). The light emitting device of Embodiment 1 above is a lateral surface light emitting type (also referred to as "side view type"), but a top surface light emitting type (also referred to as "top view type") can be employed. The lateral surface light emitting type has a structure that the mounting direction and the principal light emitting direction are perpendicular to each other. The top surface light emitting type light emitting device has a structure that the mounting direction and the principal light emitting direction are parallel to each other. The top view shape of the light emitting device, specifically, the shape seen from the principal light emitting surface, can be selected as appropriate, but a quadrangular is preferable in terms of mass production. In particular, in the case of the lateral surface light emitting type the top view shape is preferably a rectangle having a longitudinal direction and a width direction. On the other hand, in the case of the top surface light emitting type, the top view shape is preferably a square. Also, the top view shape of the first light emitting element and the second light emitting element is preferably the same as that of the light emitting device.

Mounting Board 10

The mounting board is configured with at least a base, and wiring held in that base.

Base 15. The base can be configured with resin or a fiber reinforced resin, ceramic, glass, metal, paper, etc. Examples of the resin or fiber reinforced resin include epoxy, glass epoxy, bismaleimide-triazine (BT), polyimide, etc. Examples of ceramics include aluminum oxide, aluminum nitride, zirconium oxide, zirconium nitride, titanium oxide, titanium nitride, or mixtures of these, etc. Examples of metals include copper, iron, nickel, chrome, aluminum, silver, gold, titanium, or alloys of these. Among these base materials, it is especially preferable to use base materials having physical properties close to the linear expansion coefficient of the first light emitting element and the second light emitting element. The lower limit value of the thickness of the base can be selected as appropriate, but from the perspective of mechanical strength of the mounting board, is preferably 0.05 mm or greater, and more preferably 0.2 mm or greater. Also, the upper limit value of the base thickness is preferably 0.5 mm or less, and more preferably 0.4 mm or less, from the perspective of the thickness (i.e., depth) of the light emitting device.

Intermediate Part 13

The top surface of the intermediate part 13 is positioned below the top surface of the first land 11 and the second land 12 adjacent to the intermediate part 13. In other words, the top surface of the first land 11 and the second land 12 is above the top surface of the intermediate part 13. The intermediate part 13 is positioned preferably between the first land 11 and the second land 12, does not include wiring, and is a part where the base 15 is exposed. As a result, by providing the first land 11 and the second land 12 on the top surface of the base 15, the intermediate part 13 can be formed, facilitating provision of the intermediate part 13.

First Land 11, Second Land 12, First Terminal Wiring 16, Second Terminal Wiring 17, Third Terminal Wiring 18. The wiring is formed at least on the top surface of the base, and can also be formed on the base interior and/or the lateral surface and/or the bottom surface. The wiring preferably includes lands on which the first light emitting element and the second light emitting element are mounted, terminal wiring connected with external circuits, lead wiring connected between the land and terminal wiring, etc. The wiring can be formed with copper, iron, nickel, tungsten, chrome, aluminum, silver, gold, titanium, palladium, rhodium, or alloys of these. There can be single layers or multiple layers of these metals or alloys. Copper or a copper alloy is particularly preferable from the perspective of heat dissipation. On the surface layer of the wiring, it is also possible to provide a layer of silver, platinum, aluminum, rhodium, gold, or alloys of these, etc., from the perspective of conductive adhesive member wettability and/or light reflectivity, etc., Insulating Film 19

The insulating film can be various types of solder resist or a cover lay, etc.

First Light Emitting Element 21, Second Light Emitting Element 22

The first light emitting element and the second light emitting element are at least provided with a semiconductor element structure, and in many cases are further provided with an element substrate. An example of the first light emitting element and the second light emitting element includes an LED chip, for example. The top view shape of the light emitting element is preferably a rectangular shape, and in particular a square shape or a rectangle shape that is long in one direction. The first light emitting element and the second light emitting element can also be another shape such as a hexagonal shape, which enable increase of the light emitting efficiency. The first light emitting element and the second light emitting element or the element substrate lateral surface thereof can be perpendicular to the top surface, or can be inclined inwardly or outwardly to the top surface. The first light emitting element and the second light emitting element preferably have positive-negative (p, n) electrodes on one surface side. The number of light emitting elements mounted on one light emitting device can be three or more. The same is also true for the transmissive member. In that case, as shown in FIG. 2, the recess part of the covering member can be provided between every two adjacent light emitting elements, or between every two adjacent transmissive members. The plurality of light emitting elements can be connected in series or in parallel. The semiconductor element structure preferably includes a semiconductor layered body, specifically, at least an n type semiconductor layer and a p type semiconductor layer, and has an active layer interposed between these. The semiconductor element structure can also include positive and negative electrodes and/or an insulating film. The positive and negative electrodes can be configured with gold, silver, tin, platinum, rhodium, titanium, aluminum, tungsten, palladium, nickel, or alloys of these. The insulating film can be configured with an oxide or a nitride of at least one type of element selected from the group consisting of silicon, titanium, zirconium, niobium, tantalum, aluminum, etc. The light emitting peak wavelength of the first light emitting element and the second light emitting element can be selected from the ultraviolet range to the infrared range depending on the semiconductor material and its mixed crystal ratio. As the semiconductor material, it is preferable to use a nitride semiconductor, which can emit short wavelength light capable of efficient excitation of the wavelength conversion substance. The nitride semiconductor is expressed mainly by general formula $In_xAl_yGa_{1-x-y}N$ ($0 \leq x$, $0 \leq y$, $x+y \leq 1$). The light emission peak wavelength of the first light emitting element and the second light emitting element is preferably 400 nm-530 nm, more preferably 420 nm-490 nm, and even more preferably 450 nm-475 nm, from the perspective of light emitting efficiency, as well as wavelength conversion substance excitation and the mixed color relationship with that emitted color, etc. In addition to this, it is also possible to use an InAlGaAs type semiconductor, InAlGaP type semiconductor, zinc sulfide, zinc selenide, silicon carbide, etc. The element substrate of the first light emitting element and the second light emitting element is mainly a substrate for crystal growth which can grow a semiconductor crystal for configuring the semiconductor element structure, but it is also possible to use a substrate which is joined to a semiconductor element structure separated from the substrate for crystal growth. By the element substrate being transmissive, it is easier to use flip-chip mounting, and easier to increase the light extraction efficiency. Examples of the base material of the element substrate include sapphire, spinel, gallium nitride, aluminum nitride, silicon, silicon carbide, gallium arsenide, gallium phosphide, indium phosphide, zinc sulfide, zinc oxide, zinc selenide, and diamond, etc. Among these, sapphire is preferable. The element substrate thickness can be selected as appropriate, and for example is 0.02 mm-1 mm, and from the perspective of the element substrate strength and/or the light emitting device thickness, it is preferably 0.05 mm-0.3 mm.

First Transmissive Member 31, Second Transmissive Member 32

The first transmissive member and the second transmissive member respectively are provided on the first light emitting element and the second light emitting element, and are members that transmit the light emitted from the first light emitting element and the second light emitting element to outside the device. The first transmissive member and the second transmissive member are configured with at least a base material such as that noted below. Also, the first transmissive member and the second transmissive member can function as wavelength conversion members by adding the kind of wavelength conversion substance noted hereafter in the base material. However, it is not essential to contain the wavelength conversion substance. Also, the first transmissive member and the second transmissive member can be a sintered body of the wavelength conversion substance and an inorganic substance such as alumina, etc., or a plate shaped crystal of the wavelength conversion substance, etc.

The base material of the first transmissive member and the second transmissive member can respectively be transmissive items with respect to the light emitted from the first light emitting element and the second light emitting element. The term "transmissive" in this specification means that the light transmissivity at the mission peak wavelength of the first light emitting element and the second light emitting element is preferably 60% or greater, more preferably 70% or greater, and even more preferably 80% or greater. Examples of the base material of the first transmissive member and the second transmissive member can include a glass or a resin such as at least one of silicone resin, epoxy resin, phenol resin, polycarbonate resin, acrylic resin, or modified resins of these. Among these, silicone resin and modified silicone resin are preferable because they are good resistance to heat and light. Specific examples of the silicone resin include dimethyl silicone resin, phenyl methyl silicone resin, and diphenyl silicone resin. It is possible to configure the first transmissive member and the second transmissive member with a single layer of one item among these base materials, or by laminating two or more of these base materials. The term "modified resins" in this specification include hybrid resins.

The base material of the first transmissive member and the second transmissive member can also contain various fillers in the aforementioned resins or the glass. Examples of this filler include silicon oxide, aluminum oxide, zirconium oxide, zinc oxide, etc. For the filler, it is possible to use one of these alone, or two or more of these in combination. In particular, silicon oxide which has a small thermal expansion coefficient is preferable. Also, using nanoparticles as the filler can increase in scattering including Rayleigh scattering of the blue light of the first light emitting element and the second light emitting element, thereby enabling reduction the amount of the wavelength conversion substance that is used. As the nanoparticles, particles each having a diameter of 1 nm-100 nm are used. Also, "particle diameter" in this specification is defined by $D_{50}$, for example.

Wavelength Conversion Substance 40

The wavelength conversion substance absorbs at least a portion of the primary light emitted by the first light emitting element and the second light emitting element, and emits secondary light of a different wavelength from the primary light. This can realize a light emitting device that emits the mixed light of the visible wavelength primary light and the secondary light, for example, white light. For the wavelength conversion substance, it is possible to use one type alone or a combination of two or more among the specific examples shown hereafter.

First Phosphor 41, Second Phosphor 42

The first phosphor and the second phosphor can be selected as appropriate from specific examples such as those noted hereafter. For example, it is possible to use a green to yellow light emitting phosphor as the first phosphor, and a red light emitting phosphor as the second phosphor. Examples of the green light emitting phosphor include yttrium-aluminum-garnet based phosphor (e.g. $Y_3(Al, Ga)_5O_{12}$:Ce), lutetium-aluminum-garnet based phosphor (e.g. $Lu_3(Al, Ga)_5O_{12}$:Ce), terbium-aluminum-garnet based phosphor (e.g. $Tb_3(Al, Ga)_5O_{12}$:Ce), silicate based phosphor (e.g. $(Ba, Sr)_2SiO_4$:Eu), chlorosilicate based phosphor (e.g. $Ca_8Mg(SiO_4)_4Cl_2$:Eu), β sialon based phosphor (e.g. $Si_{6-z}Al_zO_zN_{8-z}$:Eu ($0<z<4.2$)), SGS based phosphor (e.g. $SrGa_2S_4$:Eu). Examples of the yellow light emitting phosphor include a sialon based phosphor (e.g. $Mz(Si, Al)_{12}(O, N)_{16}$ (where $0<z\leq2$, and M is Li, Mg, Ca, Y, and one of lanthanide elements excluding La and Ce)). In addition, there are also yellow light emitting phosphors among the aforementioned green light emitting phosphors. Also, for example, part of yttrium in the yttrium-aluminum-garnet based phosphors can be substituted to gadolinium in order to shift the emission peak wavelength to the longer wavelength side, thereby enabling emission of yellow light. Among these, there are also phosphors that can emit orange light. Examples of the red light emitting phosphors include nitrogen-containing calcium aluminosilicate (CASN or SCASN) based phosphor (e.g. (Sr, Ca)AlSiN$_3$:Eu). In addition, examples include phosphors represented by manganese-activated fluoride based phosphors which is represented by the general formula (I) A$_2$[M$_{1-a}$Mn$_a$F$_6$]. In the aforementioned general formula (I), The term "A" is at least one type selected from a group consisting of K, Li, Na, Rb, Cs, and NH$_4$, M is one type of element selected from a group consisting of Group IV elements and Group XIV elements. a satisfies 0<a<0.2. Representative examples of this manganese-activated fluoride based phosphor can include a manganese-activated potassium fluorosilicate phosphor (e.g. K$_2$SiF$_6$:Mn).

Covering Member 50

From the perspective of upward light extraction efficiency, the light reflective covering member has the light reflectivity of preferably 70% or greater, more preferably 80% or greater, and even more preferably 90% or greater, at the light emission peak wavelength of the first light emitting element and the second light emitting element. Furthermore, the covering member preferably is white. Thus, the covering member contain a white pigment in the base material. The covering member undergoes a liquid state before curing. The covering member can be formed using transfer molding, injection molding, compression molding, potting, etc.

Covering Member Base Material

The base material of the covering member can employ resins, such as silicone resin, epoxy resin, phenol resin, polycarbonate resin, acrylic resin, or modified resins of these. Among these, silicone resin and modified silicone resin are preferable due to its good resistance to heat and light. Specific examples of silicone resins include dimethyl silicone resin, phenyl methyl silicone resin, and diphenyl silicone resin. Also, the base material of the covering member can also contain the same filler as that of the base materials of the first transmissive member and the second transmissive member described above.

White Pigment

For the white pigment, it is possible to use one type alone or a combination of two or more items from among titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. The shape of the white pigment can be selected as appropriate, and can be irregular or in granular form, but from the perspective of flowability, it is preferably spherical. Also, the particle diameter of the white pigment can be approximately 0.1 μm-0.5 μm, for example, but the smaller the better in order to increase the effects of light reflection and coating. The content of the white pigment in the light reflective covering member can be selected as appropriate, but from the perspective of viscosity when in liquid form and light reflection, it is preferably 10 wt %-80 wt %, more preferably 20 wt %-70 wt %, and even more preferably 30 wt %-60 wt %. The symbol "wt %" is percent by weight, and represents the percentage of weight of the concerned material with respect to the total weight of the light reflective covering member.

Conductive Adhesive Member 60

As the conductive adhesive member, it is possible to use any one item from among: bumps containing a metal such as a gold, silver, or copper; a metal paste containing a resin binder with a metal powder such as silver, gold, copper, platinum, aluminum, palladium; solder such as a tin-bismuth type, tin-copper type, tin-silver type, or gold-tin type; and a brazing material such as a low melting point metal.

Light Guide Member 70 transmissive member, and guides light from the light emitting element to the transmissive member. Examples of the base material of the light guide member include silicone resin, epoxy resin, phenol resin, polycarbonate resin, acrylic resin, and modified resins of these. Among these, silicone resin or modified silicone resin are preferable because they have good resistance to heat and light. Specific examples of silicone resins include dimethyl silicone resin, phenyl methyl silicone resin, and diphenyl silicone resin. Also, the base material of the light guide member can contain the same filler as that of the base material of the first transmissive member and second transmissive member described above. The light guide member can also be omitted.

EXAMPLE

Following, a detailed description is given of a example of the present disclosure. It also goes without saying that the present disclosure is not limited only to the example shown below.

Example 1

Example 1 is explained using a lateral surface light emitting type LED having a structure of the light emitting device 100 shown in FIG. 1A to 1F that has dimensions of 3.1 mm in length, 0.4 mm in height, and 0.7 mm in depth.

The dimensions of the mounting board 10 is 3.1 mm in length, 0.4 mm in width, and 0.36 mm in depth (thickness). The base 15 of the mounting board is a small piece of a rectangular solid made of BT resin (e.g., HL832NSF type LCA made by Mitsubishi Gas Chemical Company, INC.) with a linear expansion coefficient of 3 ppm/° C. The wiring has a structure of copper/nickel/gold layer laminated from the base 15 side. The wiring respectively includes a first land 11 at the X− side and a second land 12 at the X+ side, sandwiching the intermediate part 13 in the X direction at the central portion on the top surface of the base 15. The first land 11 and the second land 12 are respectively configured by a pair of a positive electrode terminal and a negative electrode terminal. Each of these terminals includes a copper layer having a projection of 0.04 mm thickness in the depth direction. The intermediate part 13 is placed between the positive electrode terminal of the first land 11 and the negative electrode terminal of the second land 12, with the base 15 exposed. The base 15 has four through-holes, and the wiring formed on the top surface and the wiring formed on the bottom surface are electrically connected via the through-holes. A first terminal wiring 16, a second terminal wiring 17, and a third terminal wiring 18 are formed on the bottom surface of the base 15. The first terminal wiring 16 is electrically connected with the negative electrode terminal of the first land. The second terminal wiring 17 is electrically connected with the positive electrode terminal of the second land. The third terminal wiring 18 is electrically connected with the positive electrode terminal of the first land and the negative electrode terminal of the second land. A cavity biased to the Y− side is formed at the X direction center of the bottom surface of the base 15, and the third terminal wiring 18 is also formed extending on the inner surface of this cavity. This cavity is a semicylinder shape having the dimensions of 0.4 mm in length, 0.2 mm in height, and 0.2 mm in depth. A portion of each wiring on the bottom surface is covered by the insulating film 19 serving as solder resist.

The first light emitting element 21 and the second light emitting element 22 are respectively flip-chip mounted on the first land 11 and the second land 12, with the conductive adhesive member 60 interposed. Each of the first light emitting element 21 and the second light emitting element 22 is rectangular solid LED chip having diameter of 1.1 mm in length, 0.2 mm in width, and 0.12 mm in depth (i.e., thickness). The first and second light emitting elements 21 and 22 can emit blue light whose emission peak wavelength is 452 nm. The first and second light emitting element 21 and 22 has a configuration in which an n type layer, an active layer, and a p type layer of a nitride semiconductor are laminated in this order on a sapphire substrate. The conductive adhesive member 60 is a gold-copper type solder (Au:Sn=79:21) with 0.015 mm depth (i.e., thickness).

The first transmissive member 31 and the second transmissive member 32 are respectively adhered on the first light emitting element 21 and the second light emitting element 22 with the light guide member 70 interposed. The first transmissive member 31 and the second transmissive member 32 are each small pieces of rectangular solids of 1.21 mm in length, 0.24 mm in width, and 0.16 mm in depth (i.e., thickness). The first transmissive member 31 and the second transmissive member 32 contains a first phosphor 41 and a second phosphor 42 in the base material 35, which is a phenyl methyl silicone resin containing nanoparticles of silicon oxide as a filler. The first phosphor is a europium-activated β SiAlON, and the second phosphor 42 is a manganese-activated potassium fluorosilicate, the first and the second phosphor serving as the wavelength conversion substances. The first transmissive member 31 and the second transmissive member 32 are respectively formed with: a layer comprising the base material 35 and the first phosphor 41, a layer comprising the base material 35 and the second phosphor 42, and a layer comprising the base material 35, laminated from the light emitting element 21 and 22 side. The light guide member 70 is a hardened substance of a dimethyl silicone resin having a depth (thickness) of 0.005 mm.

The light reflective covering member 50 is formed on the top surface of the mounting board 10, in such a manner as to enclose the entire circumference of the side of the first light emitting element 21, the second light emitting element 22, the first transmissive member 31, and the second transmissive member 32, as well as the portion of the mounting board 10 where the intermediate part 13 is positioned. The covering member 50 contains 60 wt % of titanium oxide as the white pigment in the base material which is a phenyl-methyl silicone resin. The covering member 50 is directly coated on the respective lateral surfaces of the first light emitting element 21, the second light emitting element 22, the first transmissive member 31, the second transmissive member 32, the conductive adhesive member 60, and the light guide member 70. The top surface of the covering member 50 configures substantially flush with the top surface of the first transmissive member 31 and the top surface of the second transmissive member 32. The maximum outer dimensions of the covering member 50 matches the outer dimensions on the top surface of the mounting board 10 at the bottommost part. The four lateral surfaces oriented in the X+ direction, the X− direction, the Y+ direction, and the Y− direction of the covering member 50 are respectively inwardly inclined at 0.8° with respect to the four lateral surface oriented in the X+ direction, the X− direction, the Y+ direction, and the Y− direction of the mounting board 10, specifically, the base 15. Also, the covering member 50 on the intermediate part 13, in more detail, the central portion of the top surface of the covering member 50 in the X direction (i.e., the central portion between the first transmissive member 31 and the second transmissive member 32) has the recess part 50s of 0.05 mm in length, and 0.24 mm in depth formed to reach the two lateral surfaces respectively oriented in the Y+ direction and the Y− direction.

This kind of light emitting device of Example 1 can exhibit similar effects as those of the light emitting device 100 of Embodiment 1.

The light emitting device according to an embodiment of the present disclosure can be used for a backlight device of a liquid crystal display, various types of lighting equipment, large scale displays, various types of display devices for advertising or a destination guide, etc., projector devices, and also for image reading devices of digital video cameras, fax machines, copy machines, scanners, etc.

What is claimed is:

1. A light emitting device comprising:
   a mounting board including an insulating base, a first land and a second land arranged on a top surface of the insulating base, and an intermediate part arranged between the first land and the second land with a top surface of the intermediate part being positioned below a top surface of the first land and a top surface of the second land that are adjacent to the intermediate part;
   a first light emitting element that is flip-chip mounted on the first land;
   a second light emitting element that is flip-chip mounted on the second land; and
   a light reflective covering member provided above the intermediate part, the light reflective covering member covering a lateral surface of the first light emitting element and a lateral surface of the second light emitting element, the light reflective covering member defining a recess part arranged above the intermediate part with a bottom of the recess part being positioned below a top surface of the first light emitting element and a top surface of the second light emitting element and above the top surface of the intermediate part, and a surface of the light reflective covering member defining the recess part constituting a part of an outer surface of the light emitting device with an inside of the recess part being hollow.

2. The light emitting device according to claim 1, wherein the intermediate part is an area in which the base is exposed from the first land and the second land.

3. The light emitting device according to claim 1, wherein in a top plan view, the recess part reaches to at least one of two lateral surfaces extending along an alignment direction of the first land and the second land in the light reflective coating member.

4. The light emitting device according to claim 1, wherein the light reflective covering member has an elongated shape in an alignment direction of the first land and the second land.

5. The light emitting device according to claim 1, wherein a linear expansion coefficient of the insulating base is 15 ppm/° C. or less.

6. The light emitting device according to claim 1, wherein a bottom surface of the insulating base defines a cavity at a position opposite from the recess part.

7. The light emitting device according to claim 1, wherein a lateral surface of the light reflective covering member extending along an alignment direction of the first land and the second land in a top plan view is inclined toward an inside of the light emitting device with respect to a lateral surface of the mounting board extending along the alignment direction of the first land and the second land in the top plan view.

8. The light emitting device according to claim 1, further comprising:
a first transmissive member joined to the top surface of the first light emitting element, containing a wavelength conversion substance configured to absorb light of the first light emitting element and to emit light; and
a second transmissive member joined to the top surface of the second light emitting element, containing a wavelength conversion substance configured to absorb light of the second light emitting element and to emit light, wherein
the light reflective covering member covers a lateral surface of the first transmissive member and a lateral surface of the second transmissive member.

9. The light emitting device according to claim 8, wherein the wavelength conversion substance of at least one of the first transmissive member and the second transmissive member contains a manganese-activated fluoride phosphor.

10. The light emitting device according to claim 3, wherein
in the top plan view, the recess part reaches to both of the two lateral surfaces.

11. The light emitting device according to claim 1, wherein
the bottom of the recess part being positioned below a top surface of a semiconductor layer of the first light emitting element and a top surface of a semiconductor layer of the second light emitting element.

12. The light emitting device according to claim 1, wherein
the bottom of the recess part being positioned below a bottom surface of the first light emitting element and a bottom surface of the second light emitting element.

13. The light emitting device according to claim 1, wherein
a shape of the recess part in cross sectional view is one of a rectangular shape, an inverted triangle shape and an inverted trapezoid shape.

* * * * *